(12) United States Patent
Pack et al.

(10) Patent No.: US 11,770,919 B1
(45) Date of Patent: Sep. 26, 2023

(54) MATERIAL DESIGN OF EMI OPTIMIZED SHIELDING ON INTEGRATED POWER ELECTRONICS

(71) Applicant: GM Global Technology Operations LLC, Detroit, MI (US)

(72) Inventors: Seongchan Pack, West Bloomfield Township, MI (US); Anthony Michael Coppola, Rochester Hills, MI (US); James R. Salvador, East Lansing, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/862,732

(22) Filed: Jul. 12, 2022

(51) Int. Cl.
*H05K 9/00* (2006.01)
(52) U.S. Cl.
CPC ................. *H05K 9/0081* (2013.01)
(58) Field of Classification Search
CPC .................................................. H05K 9/0088
See application file for complete search history.

(56) References Cited

U.S. PATENT DOCUMENTS

| 5,639,989 A * | 6/1997 | Higgins, III | .......... H01L 23/552 174/394 |
| 2005/0045358 A1* | 3/2005 | Arnold | ................ H05K 9/0024 174/51 |

* cited by examiner

*Primary Examiner* — Hung V Ngo
(74) *Attorney, Agent, or Firm* — Vivacqua Crane, PLLC

(57) ABSTRACT

An electromagnetic interference shielding composite. The electromagnetic interference shielding composite includes a polymer substrate formed into a shape of a packaging component. The composite further includes an electromagnetic interference layer contacting the polymer substrate and a conductive coating contacting the electromagnetic interference layer. An integrated power electronic module includes packaging including the electromagnetic interference shielding composite. A method of forming the electromagnetic interference shielding composite for an integrated power electronic module includes molding a polymer substrate into a shape of a packaging component, forming an electromagnetic interference layer on the polymer substrate, and forming a conductive coating on the electromagnetic interference layer.

20 Claims, 10 Drawing Sheets

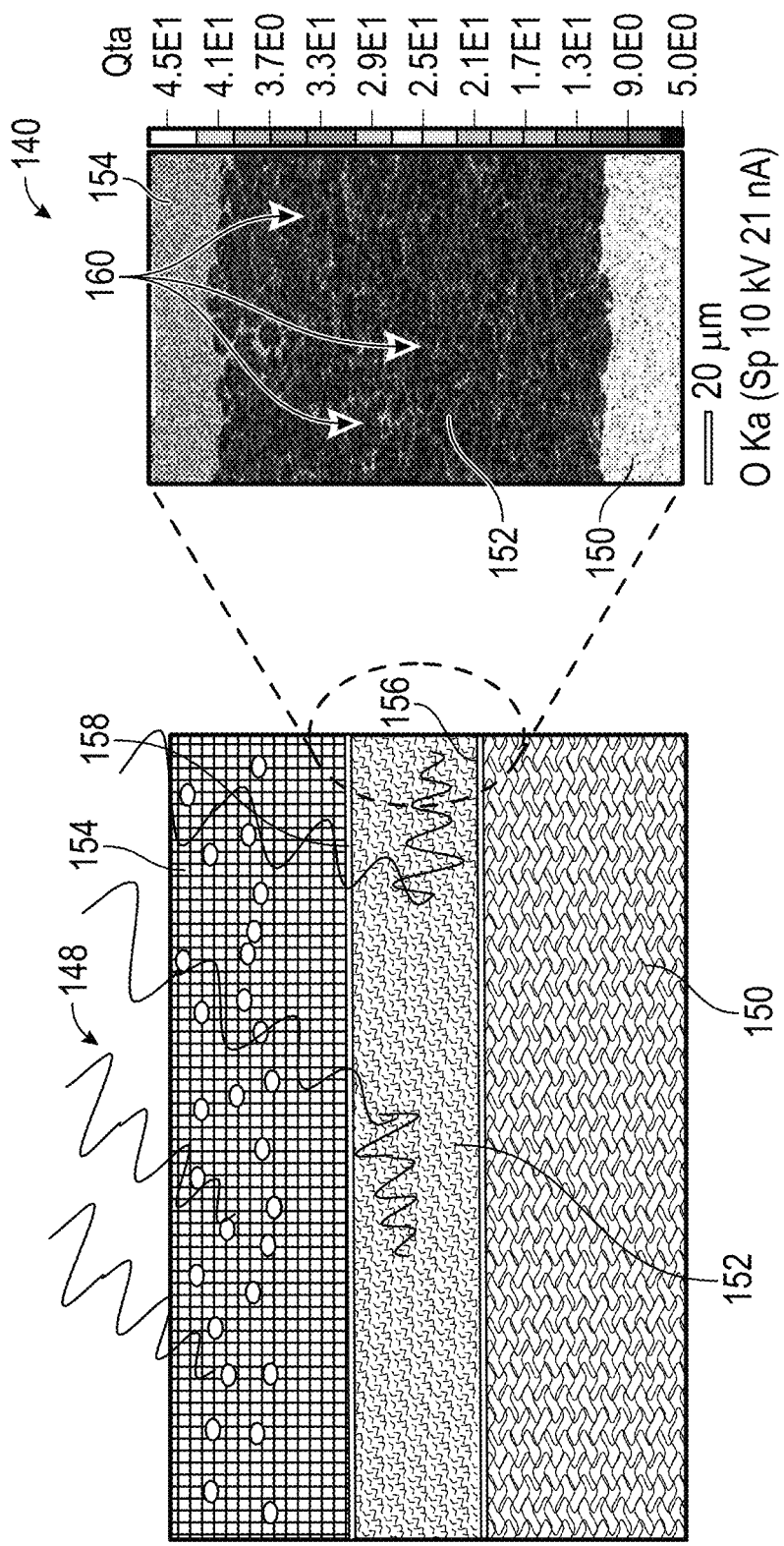

MATERIAL DESIGN OF EMI OPTIMIZED SHIELDING ON INTEGRATED POWER ELECTRONICS

INTRODUCTION

Electric and hybrid vehicles utilize integrated power electronics to perform several functions in the vehicle. Such functions include controlling the flow of energy, converting electrical power, and distributing electrical power to different systems in the vehicle. Furthermore, various electrical components may be integrated together.

Power electronics modules, including inverters, DC to DC converters, on-board chargers, etc., may use packaging components, such as housings and covers, formed of metallic materials, such as aluminum. To achieve relative higher efficiency and power output from integrated power electronics, electromagnetic interference (EMI) shielding is required over a broad range of frequencies. Further, improper cooling materials design/architecture of the power electronics can degrade the efficiency of EMI shielding, which may result in demagnetization at high temperature and vibration. Use of polymer materials for electronics packaging provides relatively higher levels of integration of components such as invertors or advanced driver assistance systems. However, use of relatively light-weight polymeric composite integrated power electronic packaging is facilitated by robust EMI shielding effectiveness.

Thus, while present integrated electronics packaging achieves its intended purpose, there is a need for new and improved polymer materials for integrated power electronic packaging.

SUMMARY

According to several aspects, the present disclosure relates to an electromagnetic interference shielding composite. The electromagnetic interference shielding composite includes a polymer substrate formed into a shape of a packaging component. The composite further includes an electromagnetic interference layer contacting the polymer substrate, and a conductive coating contacting the electromagnetic interference layer.

According to aspects of the above, the electromagnetic interference layer exhibits a thickness in a range of 2 micrometers to 100 micrometers.

According to any of the above aspects, the electromagnetic interference layer includes grains having a size in a range of 10 nanometers to 20 micrometers.

According to any of the above aspects, the electromagnetic interference layer exhibits a shielding efficiency in the range of 10 decibels to 45 decibels in a frequency range of 50 MHZ to 400 MHz.

According to any of the above aspects, the electromagnetic interference layer is formed from one or more of the following electromagnetic interference materials: silicon, zinc, $Fe_2O_3$, FeO, $ZnFe_2O_4$, Ni—Zn, Mn—ZnO, Co—ZnO, NiAl—Mn, Co—$TiO_2$, $BaTiO_3$, and $ZrO_3$.

According to any of the above aspects, the conductive coating exhibits at least one of a thermal conductivity in a range of 10 W/m-K to 200 W/m-K and an electrical resistivity in the range of $1\times10^{-5}$ Ohm-m to $1\times10^{-8}$ Ohm-m.

According to any of the above aspects, the conductive coating exhibits a thickness in a range of 10 nanometers to 500 micrometers.

According to any of the above aspects, the conductive coating exhibits a shielding efficiency in a range of 25 decibels to 45 decibels in a frequency range of 400 MHz to 1000 MHz.

According to any of the above aspects, the conductive coating includes one or more of the following: copper, aluminum, nickel, zinc, cobalt, manganese, Al-bronze, AlSi, CuO, ZnO, and $Al_2O_3$.

According to any of the above aspects, the polymer substrate comprises foam and exhibits a thickness in the range of 0.5 millimeters to 3 millimeters.

According to any of the above aspects, the electromagnetic interference layer includes grains having a size in a range of 10 nanometers to 20 micrometers and the electromagnetic interference layer exhibits a shielding efficiency in the range of 10 decibels to 45 decibels in a frequency range of 50 MHZ to 400 MHz.

According to any of the above aspects, the conductive coating exhibits a thickness in the range of 10 nanometers to 500 micrometers and the conductive coating exhibits a shielding efficiency in a range of 25 decibels to 45 decibels in the 400 MHz to 1000 MHz range.

According to several aspects, the present disclosure relates to an integrated power electronic module. The integrated power module includes packaging and electronics housed within the packaging. The packaging includes an electromagnetic interference shielding composite. The electromagnetic interference shielding composite includes a polymer substrate formed into a shape of a packaging component, an electromagnetic interference layer contacting the polymer substrate, and a conductive coating contacting the electromagnetic interference layer.

In any of the above aspects, the packaging includes a housing compartment and a cover.

In any of the above aspects, the cover defines at least one opening and includes an interior surface, and a seal surrounding the opening is affixed to the interior surface.

In any of the above aspects, the polymer substrate comprises foam and exhibits a thickness in a range of 0.5 millimeters to 3 millimeters.

In any of the above aspects, the electromagnetic interference layer includes grains having a size in a range of 10 nanometers to 20 micrometers and the electromagnetic interference layer exhibits a shielding efficiency in the range of 10 decibels to 45 decibels in a frequency range of 50 MHz to 400 MHz.

In any of the above aspects, the conductive coating exhibits a thickness in the range of 10 nanometers to 500 micrometers and the conductive coating exhibits a shielding efficiency in a range of 25 decibels to 45 decibels in a frequency range of 400 MHz to 1000 MHz range.

According to several aspects, the present disclosure relates to a method of forming an electromagnetic interference shielding composite according to any of the above aspects for an integrated power electronic module. The method includes molding a polymer substrate into a shape of a packaging component, forming an electromagnetic interference layer on the polymer substrate, and forming a conductive coating on the electromagnetic interference layer.

BRIEF DESCRIPTION OF THE DRAWINGS

The drawings described herein are for illustration purposes only and are not intended to limit the scope of the present disclosure in any way.

FIG. 2A illustrates a schematic of electromagnetic interference (EMI) shielding composite according to an embodiment of the present disclosure.

FIG. 2B illustrates a scanning electron microscope oxygen elemental map of an electromagnetic interference shielding composite according to an embodiment of the present disclosure. The scale in the bottom left hand side of the image represents 20 micrometers. In addition, the x-ray line used to create the map is the K-alpha.

DETAILED DESCRIPTION

Figure 1A:
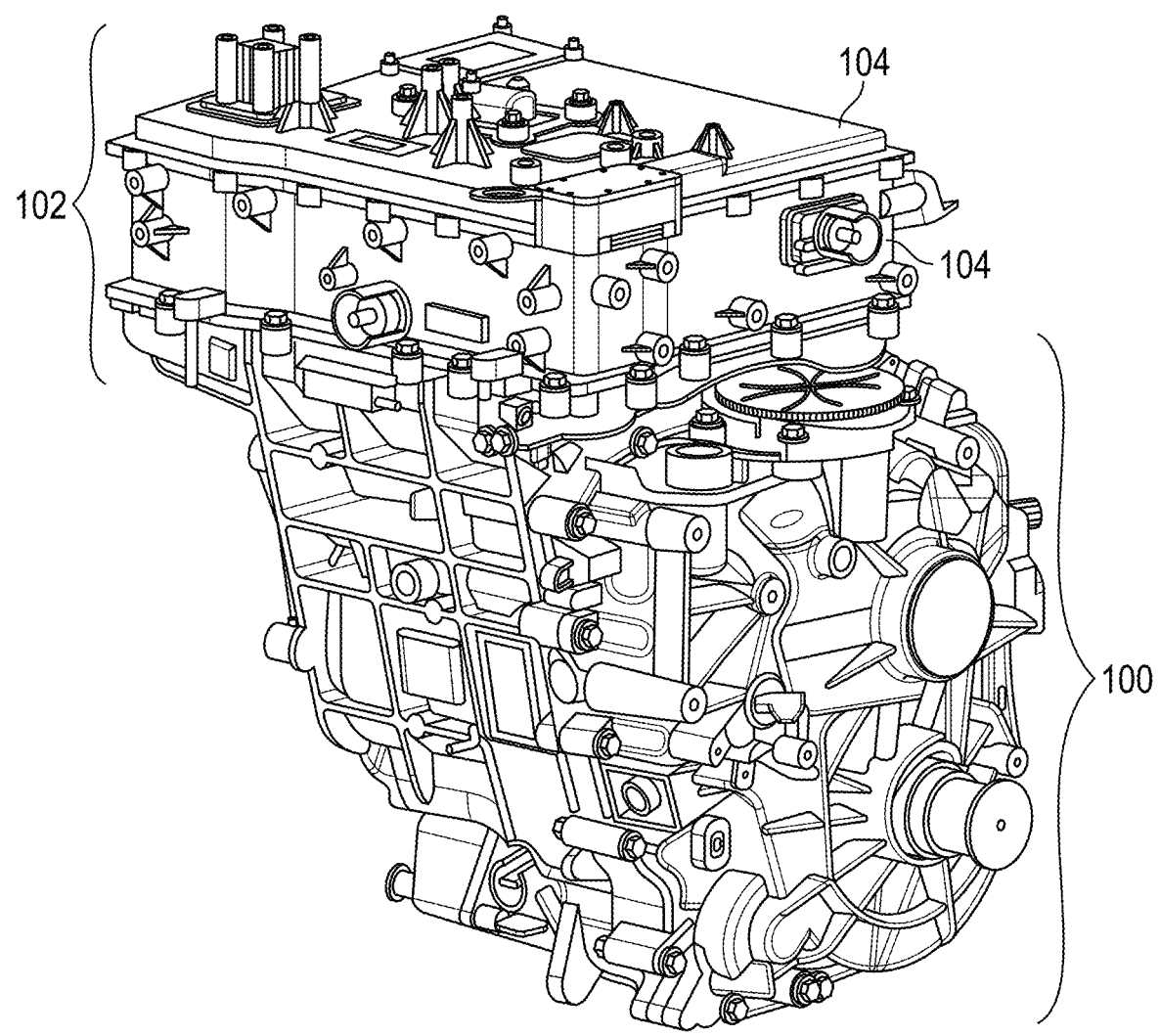
FIG. 1A illustrates a schematic of a power electronics module and motor drive unit according to an embodiment of the present disclosure.

The following description is merely exemplary in nature and is not intended to limit the present disclosure, application, or uses. Furthermore, there is no intention to be bound by any expressed or implied theory presented in the preceding technical field, background, brief summary or the following detailed description. It should be understood that throughout the drawings, corresponding reference numerals indicate like or corresponding parts and features.

As used herein, the term "vehicle" is not limited to automobiles. While the present technology is described primarily herein in connection with automobiles, the technology is not limited to automobiles. The concepts can be used in a wide variety of applications, such as in connection with aircraft, marine craft, other vehicles, and consumer electronic components.

Figure 1B:
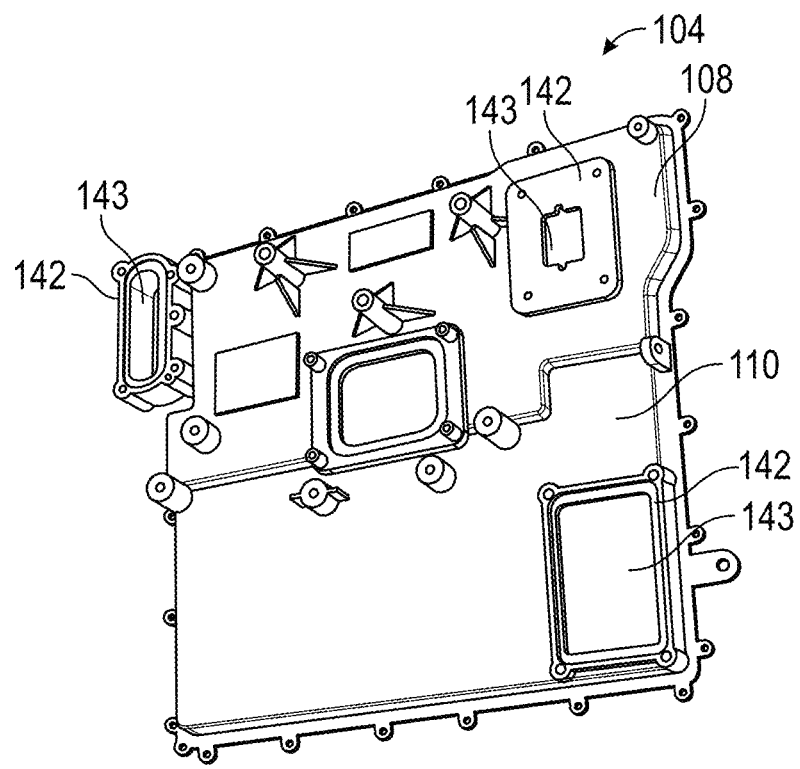
FIG. 1B illustrates a cover for a power electronics module according to an embodiment of the present disclosure.
Figure 1C:
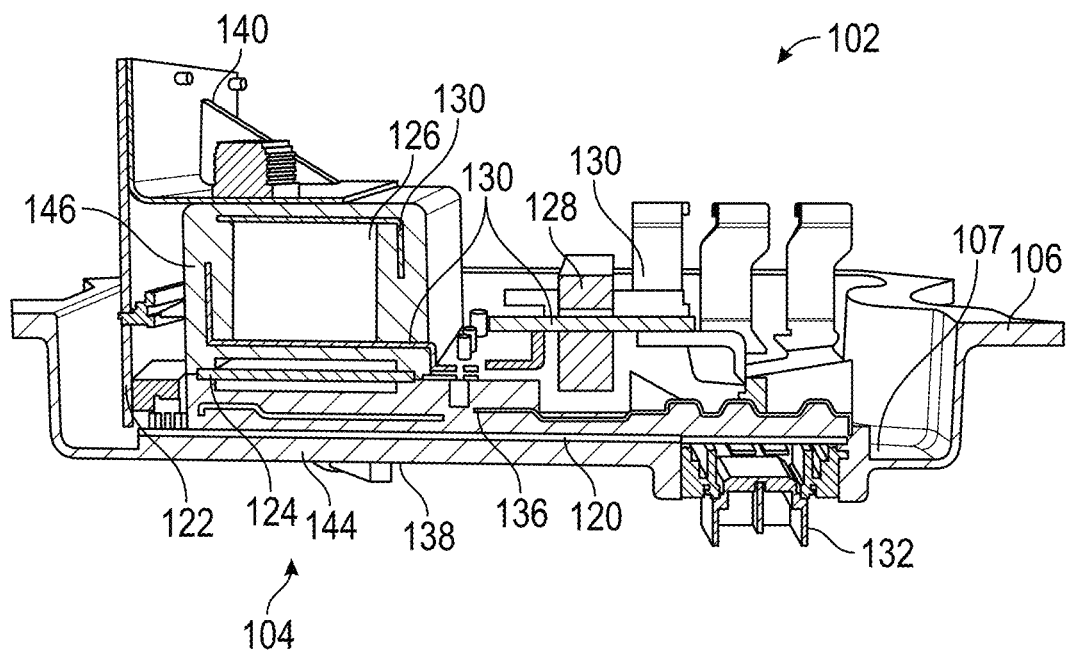
FIG. 1C illustrates a cross-sectional view of a power electronics module with the cover removed according to an embodiment of the present disclosure.

FIG. 1A illustrates a power electronics module 102 integrated into an electrically powered drive unit 100. The integrated power electronics module 102 includes packaging 104, illustrated in FIGS. 1B and 1C, for housing the power electronics module 102. The packaging 104 includes a housing compartment 106 and a housing cover 108 for the integrated power electronics module 102. It should be appreciated that just a housing without a cover, or multiple covers for a single housing, as well as various dividing walls may be provided for the packaging 104. In the illustrated aspect, the integrated power electronics module 102 includes electronics used in an inverter including a control circuit board 120 coupled to a gate circuit board 122, a power module 124, a bulk capacitor 126, a current sensor 128, bus bars 130, and a connector 132 also coupled to the control circuit board 120. In other aspects, the integrated power electronics module 102 includes electronics used in advanced driver assistance systems, DC/DC, DC/AC converters, LiDAR/LADAR etc. The integrated power electronics module 102 also includes various shielding components, including an aluminum inner shield 136 and an aluminum outer shield 138 as well as an aluminum bracket 140 for securing the gate circuit board 122. The packaging 104 includes several components, including an external polymer housing compartment 144, an internal polymer housing compartment 146 for housing the bulk capacitor 126, and the cover 108. As illustrated one or more seals 142 is affixed to the interior surface 110 of the cover 108 to prevent debris, moisture, or gasses from entering one or more openings 143 defined in the cover 108. Although not illustrated, openings may also be defined by the housing compartment 106 and seals may be provided on the interior surface 107 of the housing compartment 106. The seal is formed from, for example, one or more of the following polymer materials: thermoplastic elastomer, silicone, thermoplastic urethane, natural rubber, synthetic rubber, and foam including crosslinked foam.

At least a portion of the polymer components in the packaging 104 may be formed using an electromagnetic interference (EMI) shielding composite 148, such as the cover 108 and the housing compartment 106, as illustrated in FIGS. 2A and 2B. The EMI shielding composite includes a polymer substrate 150, an electromagnetic interference (EMI) layer 152, and a conductive coating 154. In aspects, the electromagnetic interference layer 152 directly contacts a surface 156 of the polymer substrate 150, and the conductive coating 154 directly contacts a surface 158 of the electromagnetic interference (EMI) layer 152. In alternative aspects, an adhesive layer (not illustrated) is provided between the polymer substrate 150 and the electromagnetic interference layer 152, the electromagnetic interference layer 152 and the conductive coating 154, or between the polymer substrate 150 and the electromagnetic interference layer 152 and the electromagnetic interference layer 152 and the conductive coating 154. The adhesive includes at least one of a hot melt and an embedded adhesive and is in the range of 0.5 micrometers to 10 micrometers, including all values and ranges therein.

The polymer substrate 150 is shaped into the desired shape to house the electronics in the integrated power electronics module 102 and may include one or more of the following polymer materials: foam, elastomers, thermoplastics, thermoplastic elastomers, thermosets, fiber reinforced composites, epoxies, etc. In applications, such as the power electronics module 102 illustrated in FIGS. 1A through 1C, the polymer substrate 150 is formed of foam and has a thickness in the range of 0.5 millimeters to 3 millimeters, including all values and ranges therein. In alternative aspects, the thickness may be greater than 3 millimeters, such as up to 10 millimeters, including all values and ranges from 3 millimeters to 10 millimeters.

The electromagnetic interference layer 152 is disposed on the surface 156 of the polymer substrate 150. The EMI layer 152 is 1 micrometer to 100 micrometers in thickness, including all values and ranges therein. The EMI layer 152 is understood to absorb or reflect electromagnetic waves incident on the EMI layer 152, such as those exhibiting a frequency in the range of 50 MHz to 400 MHz, including all values and ranges therein and exhibits a shielding efficiency in the range of 10 decibels or more, such as in the range of 10 to 45 decibels in the 50 MHz to 400 MHz range, as measured by ASTM D4935-99. It is understood that at 45 decibels at least 95 percent of the incident electromagnetic interference is shielded.

The EMI layer 152 is formed from an electromagnetic interference material including one or more of the following materials: a metal, a metal alloy, an intermetallic, a semiconductor, and a ceramic. The electromagnetic interference material exhibits grains 160, which are understood as crystallites of the metal, metal alloy, intermetallic, semiconductor, or ceramic materials. The grains 160 may range in size, measured along the longest linear dimension, in the range of 10 nanometers to 20 micrometers, including all values and ranges therein. In further aspects, the EMI layer 152 is formed from one or more of the following electromagnetic interference (EMI) materials: silicon, zinc, ferrites such as $Fe_2O_3$, FeO, and $ZnFe_2O_4$; ferrite variants such as Ni—Zn—$Fe_2O_4$; and diamagnetic variants with transition metals, such as Mn—ZnO, Co—ZnO, NiAl—Mn, Co—$TiO_2$, $BaTiO_3$, and $ZrO_3$. In additional aspects, the EMI materials forming the EMI layer 152 are deposited as a plurality of particles. The particles 154 exhibit a particle size in the range of 40 micrometers to 60 micrometers, including all values and ranges therein, such as 50 micrometers. In further aspects, the particles 154 are dispersed in a binder, wherein the binder is a polymer material such as epoxy, urethane, and polyester.

The conductive coating 154 is disposed on a surface 158 of the electromagnetic interference layer 152 and exhibits at least one of thermally conductivity and electrical conductivity. The conductive coating 154 is used as one or both of a thermal shunt path and an electrical shunt path, for providing thermal dissipation or an electrical ground, respectively. A thermally conductive, conductive coating 154 exhibits a thermal conductivity in a range of 10 Watts per meter*Kelvin (W/m-K) to 200 W/m-K, including all values and ranges therein for the conductive layer 154 as measured by steady state or transient techniques including flash diffusivity, transient plane source methods or transient hot wire techniques. An electrically conductive, conductive coating 154 exhibits an electrical resistivity in the range of $1 \times 10^{-5}$ Ohm-m to $1 \times 10^{-8}$ Ohm-m, including all values and ranges therein. The conductive coating 154 is understood to reflect electromagnetic waves at relatively high frequencies in the range of 400 MHz to 1000 MHz, including all values and increments therein, and exhibits a shielding efficiency in the range of 25 decibels or more, such as in the range of 25 to 45 decibels in the 400 MHz to 1000 MHz range, as measured by to ASTM D 4935-99, wherein at 45 decibels it is understood that at least 95 percent of the incident electromagnetic interference is shielded. The conductive layer includes one or more of the following: metals, intermetallics, ceramics, and semiconductors. The metals, intermetallics, ceramics, and semiconductors include, for example, copper, aluminum, nickel, cobalt, manganese, Al-bronze, AlSi, CuO, ZnO, and $Al_2O_3$. In aspects, the metals, intermetallics, ceramics, and semiconductors are selected based on thermal conductivity, electrical resistivity, or both thermal conductivity and electrical resistivity.

Described with reference to FIG. 3 through FIG. 8B are illustrative examples, which are exemplary in nature and not meant to limit the scope of the present disclosure.

Figure 3:
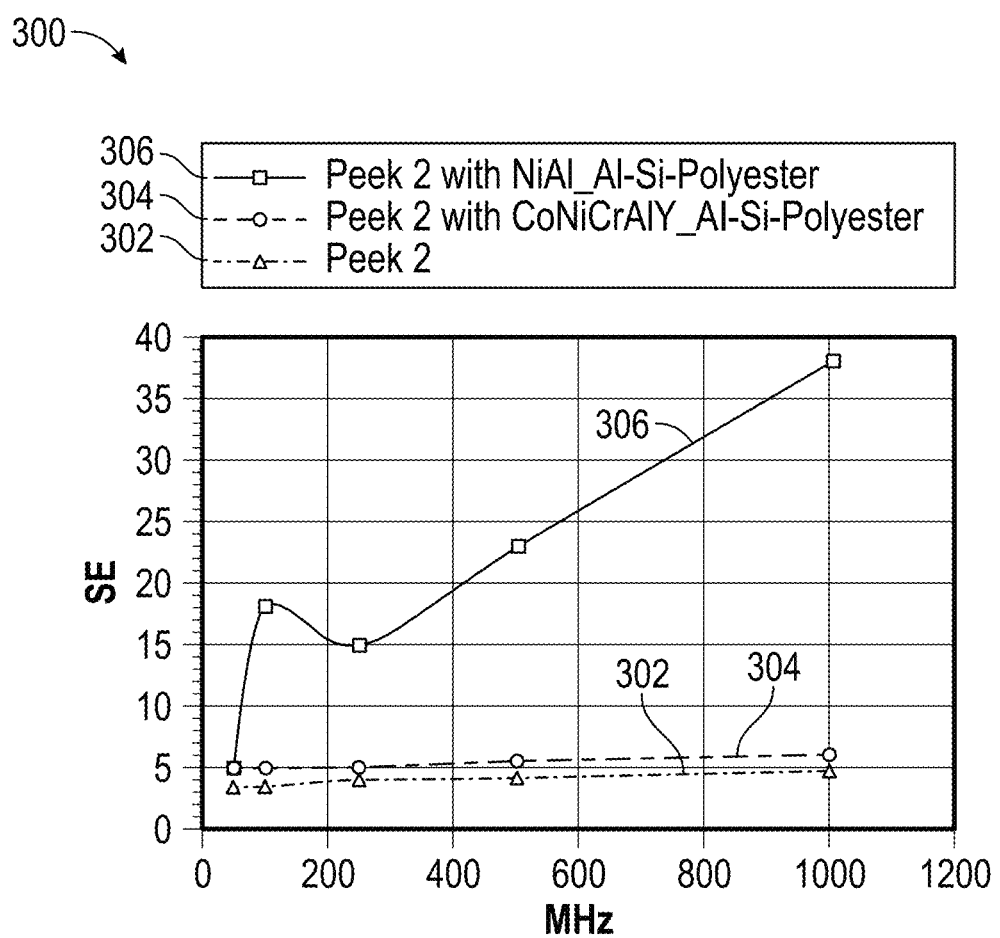
FIG. 3 illustrates a graph of EMI shielding composite efficiency for a polymer substrate and the same polymer substrates with different coatings.

Reference is now made to FIG. 3, with further reference to FIGS. 2A and 2B. FIG. 3 is a graph 300 illustrating the effect of electromagnetic interference shielding effectiveness at various frequencies for an illustrative example of an electromagnetic shielding composite 148 described herein. Shielding effectiveness (SE), may be understood as the ratio of impinging energy to residual energy, wherein when an electromagnetic wave passes through an EMI layer, impinging energy is the energy that impinges on the EMI layer and residual energy is the energy that passes through the layer. Specifically, the shielding effectiveness, in decibels, was determined over a span of frequencies from 50 MHz to 1000 MHz in accordance with ASTM D 4935-99, for the following: a polyether ether ketone substrate without a coating illustrated by trendline 302; a polyether ether ketone polymer substrate 150 including a CoNiCrAlY EMI layer 152 and an AlSi polyester conductive coating 154 illustrated by trendline 304; and a polyether ether ketone polymer substrate 150 with a NiAl EMI layer 152 and a AlSi polyester conductive coating 154 illustrated by trendline 306. As seen in the example, the NiAl EMI layer 152 provides significantly increased levels of shielding effectiveness at frequencies of 100 MHz and greater and the shielding effectiveness of the NiAl-EMI layer 152 is greater than that of the CoNiCrAlY EMI layer 152.

Figure 4A:
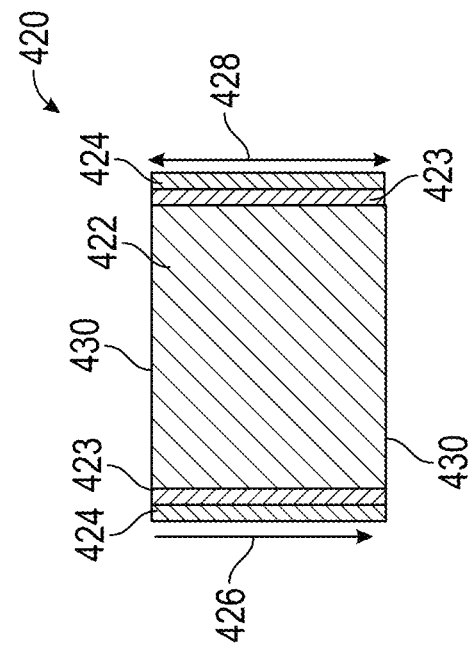
FIG. 4A illustrates a thermal conductance using shunts perpendicular to the direction of heat flow.
Figure 4B:
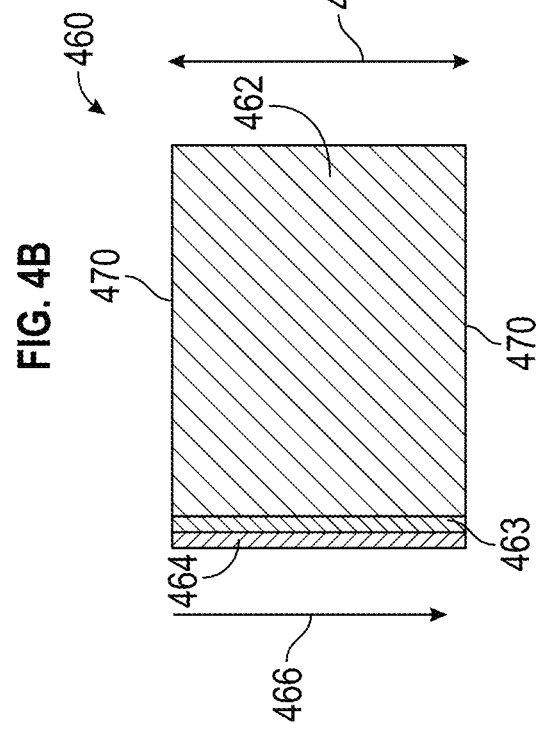
FIG. 4B illustrates a thermal conductance using shunts parallel to the direction of heat flow.
Figure 4C:
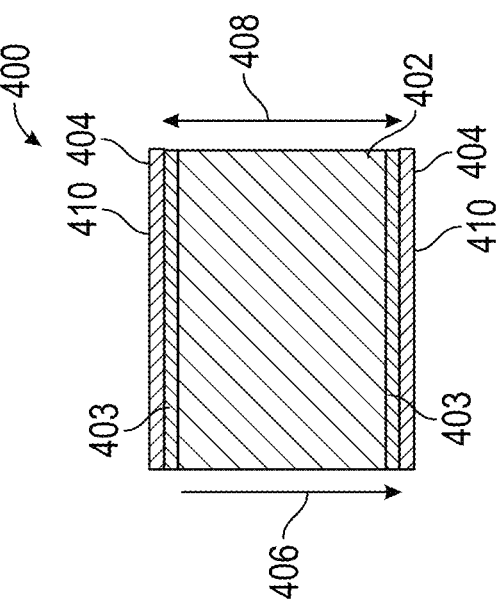
FIG. 4C illustrates a thermal conductance using a joined metal shunts both perpendicular and parallel to the direction of heat flow.
Figure 4D:
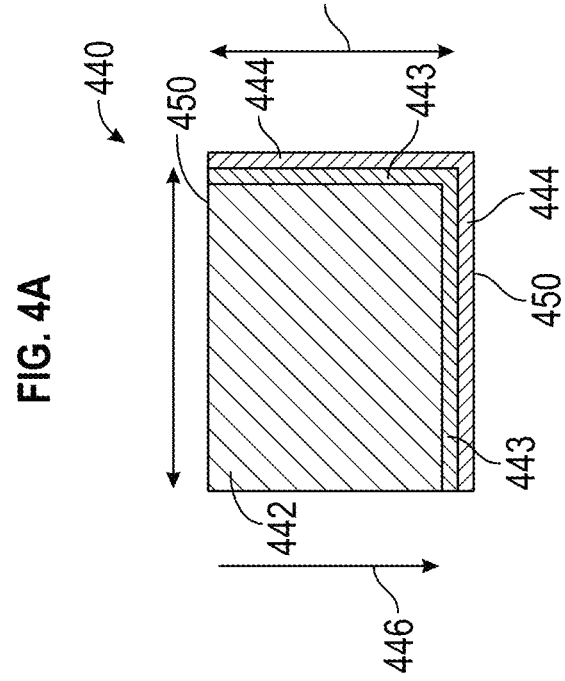
FIG. 4D illustrates a thermal conductance using shunts parallel to the direction of heat flow.

FIGS. 4A through 4E provide an illustrative example of how geometry affects thermal conductance. FIG. 4A illustrates an EMI composite 400 including polyether ether ketone 402 sandwiched by ZnO EMI layer 403 with an Al-bronze conductive coating 404 perpendicular to the direction 406 of heat flow. Using steady state heat flow and Fourier methods, the thermal conductivity of the composite 400 at 300 Kelvin (K) was found to be 0.331 Watts per meter*Kelvin (W/m-K) over a distance 408 of 4.453 millimeters measured from the exterior surfaces 410 of the composite 400. FIG. 4B illustrates a composite 420 including polyether ether ketone 422 sandwiched by ZnO EMI layer 423 and an Al-bronze conductive coating 424 parallel to the direction 426 of heat flow. Using steady state heat flow and Fourier methods, the thermal conductivity of the composite 420 at 300 K was found to be 0.946 Watts per meter*Kelvin (W/m-K) over a distance 428 of 2.353 millimeters measured from the exterior surfaces 430 of the composite 420. FIG. 4C illustrates a composite 440 including polyether ether ketone 442 boarded on two adjoining sides by NiAl EMI layer 443 and an Al-bronze conductive coating 444 parallel and perpendicular to the direction 446 of heat flow. Using steady state heat flow and Fourier methods, the thermal conductivity of the composite 440 at 300 K was found to be 1.376 Watts per meter*Kelvin over a distance 448 of 3.746 millimeters measured from the exterior surfaces 450 of the composite 440. FIG. 4D illustrates a composite 460 including polyether ether ketone polymer substrate 462 including a ZnO EMI layer 463 and an Al-bronze conductive coating 464 on one side of the polymer substrate 462 parallel to the direction 466 of heat flow. Using steady state heat flow and Fourier methods, the thermal conductivity of the composite 460 at 300 K was found to be 0.4 Watts per meter*Kelvin to 1.2 Watts per meter*Kelvin over a distance 468 of 3.568 millimeters measured from the exterior surfaces 470 of the composite 460.

Figure 4E:
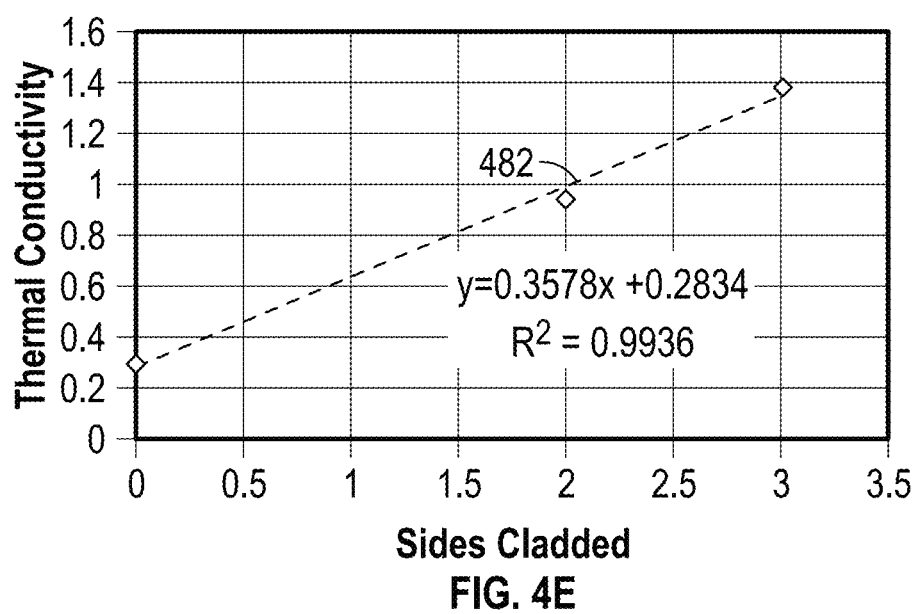
FIG. 4E is a graph illustrating the effect of cladding on the thermal conductivity for a fixed polymer aspect ratio and coating thickness, assuming heat flow parallel to the coating, and not perpendicular to the coating.

FIG. 4E illustrates a graph 480 of the thermal conductivities of the illustrative examples of the EMI shielding composites of FIGS. 4A through 4D relative to the number of sides clad by the ZnO EMI layers. With reference to trendline 482, as the number of sides of the polymer substrate clad by AlNi EMI layers increases, the greater the thermal conductivity of the EMI shielding composite.

Figure 5:
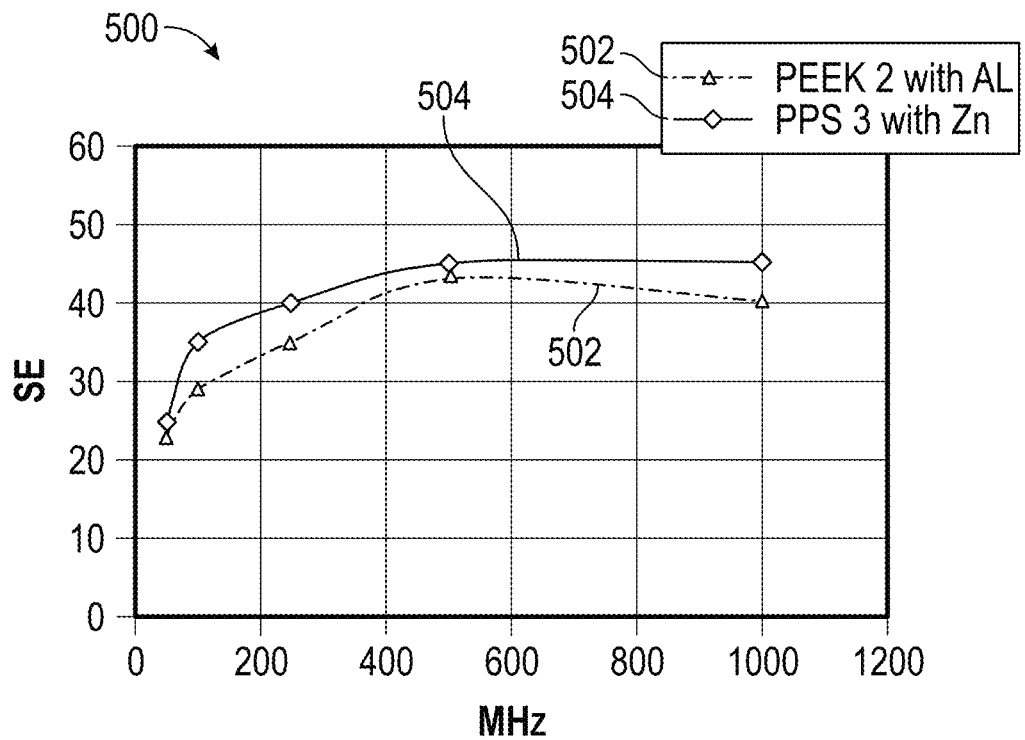
FIG. 5 is a graph illustrating the effect of various EMI shielding composites.

Turning now to FIG. 5, and with further reference to FIGS. 2A and 2B, the graph 500 illustrates the effect of EMI shielding with different EMI layers 152 deposited on a polymer substrate 150. Shielding effectiveness measurements were taken for the following: a polyether ether ketone polymer substrate 150 coated with an aluminum EMI layer 152 illustrated by trendline 502; and a polyphenylene sulfide polymer substrate 150 coated with a zinc EMI layer 152 illustrated by trendline 504. Measurements were made at frequencies spanning 50 MHz to 1000 MHz, measured according to ASTM D4935-99. As illustrated, the zinc coating 504 performed better than the aluminum coating 502 as the electromagnetic shielding effectiveness of the zinc was higher than that of the aluminum as an EMI layer 152.

Figure 6:
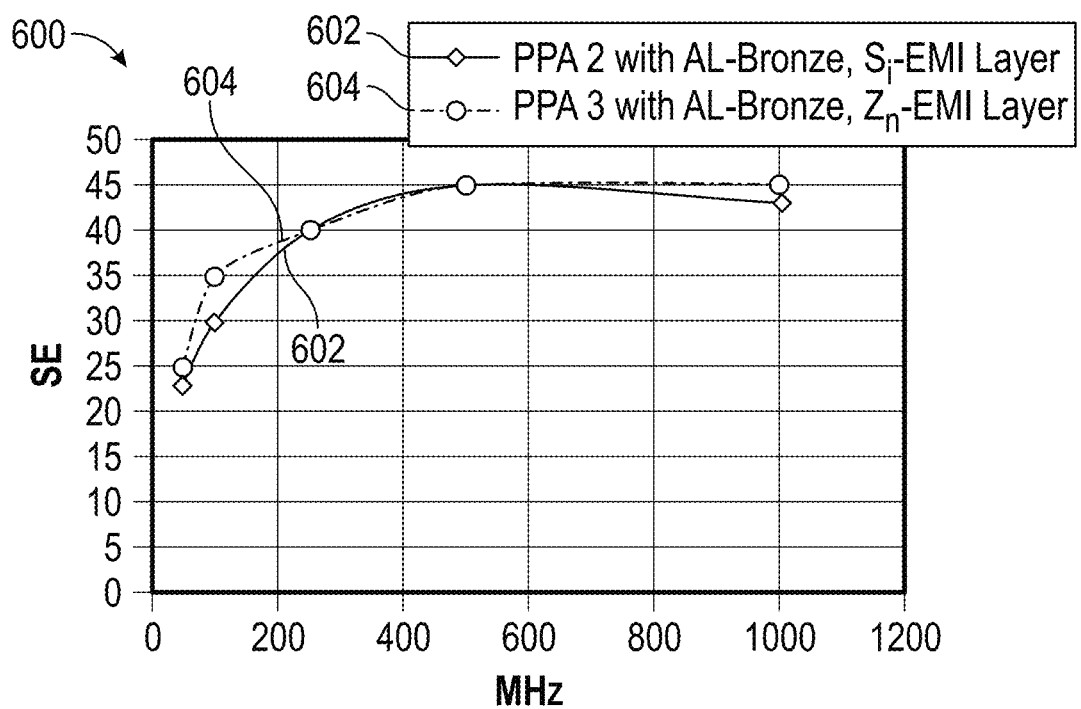
FIG. 6 is a graph illustrating the effect of various EMI shielding composites.

FIG. 6, with further reference to FIGS. 2A and 2B, illustrates another graph 600 demonstrating the effect of EMI shielding using different EMI layers in an electromagnetic interference shielding composite 148. Shielding effectiveness measurements were taken for the following: a polyphthalamide polymer substrate 150 including a silicon EMI layer 152 and an Al-bronze conductive coating 154 illustrated by trendline 602; and a polyphthalamide polymer substrate 150 including a Zn EMI layer 152 and an Al-bronze conductive coating 154 illustrated by trendline 604. As seen in the graph 600, the zinc EMI layer 604 performs relatively better at lower frequencies than the silicon EMI layer 602 and at higher frequencies both illustrative EMI shielding composites 148 performed similarly, which may be attributed, in part to contributions from the Al-bronze conductive coatings 154.

Figure 7A:
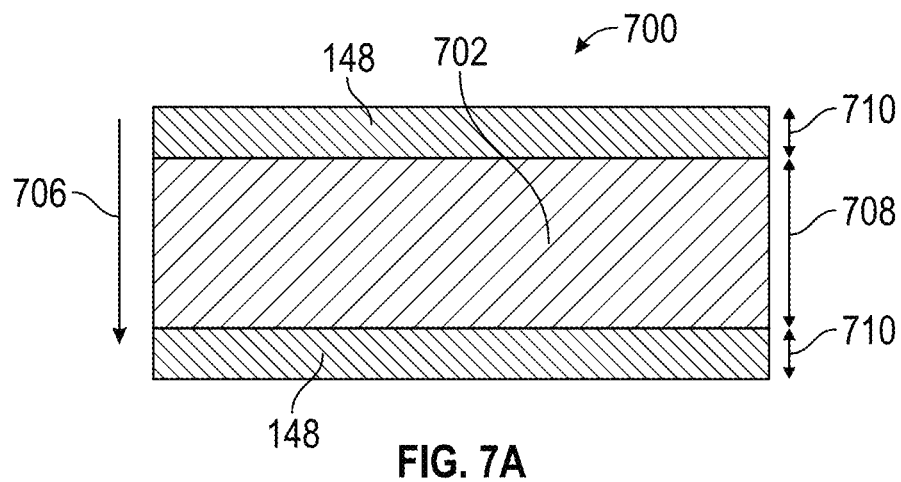
FIG. 7A illustrates a schematic of the steel with EMI shielding composites.
Figure 7B:
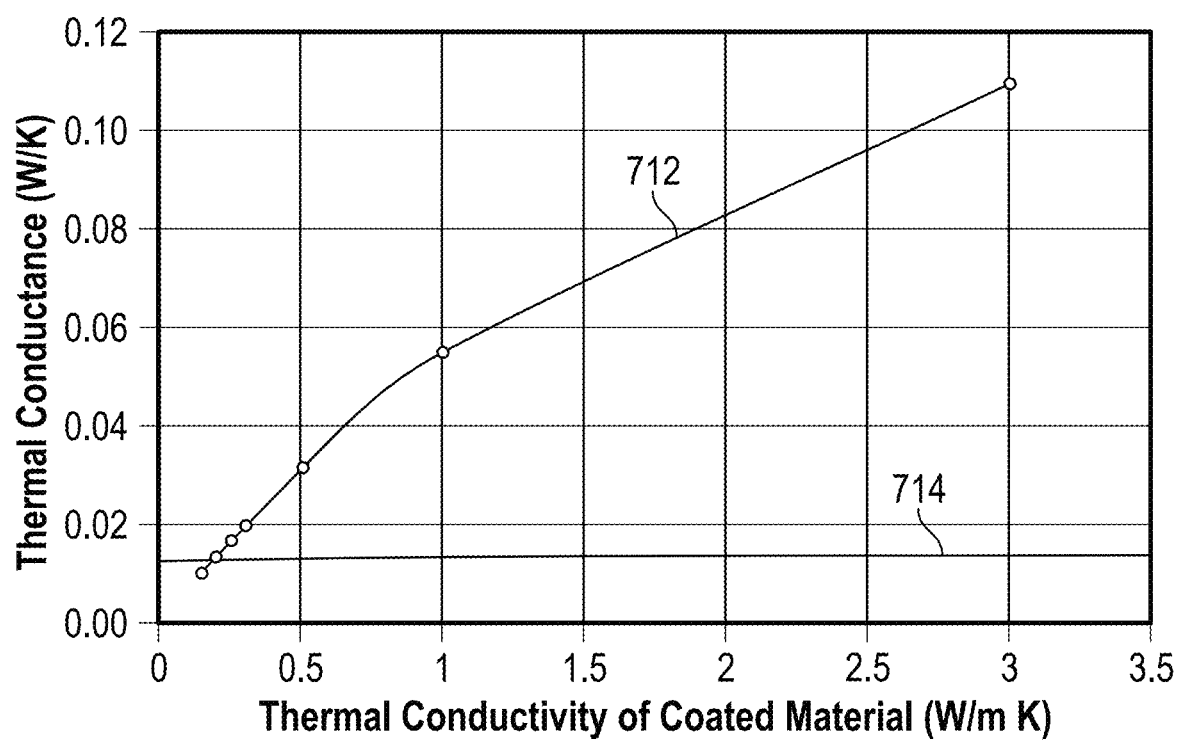
FIG. 7B is a graph illustrating the effect of thermal conductivity on thermal conductance of a steel sheet including an EMI shielding composites.

FIGS. 7A and 7B provide an illustrative example of the effect on thermal conductance of the thermal conductivity of sandwiches of the EMI shielding composites 148 on a steel sheet. FIG. 7A illustrates a schematic of the sandwiches 700 as tested. The sandwiches 700 included a silicon steel sheet 702 sandwiched between two EMI shielding composite layers 148, wherein the substrate layer is polyphthalamide, the EMI layer is ZnO, and the conductive layer is Al-bronze, and the EMI shielding composite layers 148 are aligned perpendicular to the direction 706 of heat flow. Epoxy adhesive layers of 2 micrometers in thickness were used to bond the steel sheet 702 to the EMI shielding composite layers 148. The steel sheet 702 exhibited a thickness 708 of 0.25 millimeters and the EMI shielding composite layers 148 each exhibited a thickness of 0.01 millimeters. As seen in FIG. 7B, it was found that as the thermal conductivity of the EMI shielding composite layers 148 increased, the thermal conductance of the EMI shielding composite layers 148 and the steel sheet 702 increased as evidenced by 710. The thermal conductance of the sheet steel with an adhesive material alone was found to be 0.011 W/K illustrated by line 714.

Figure 8A:
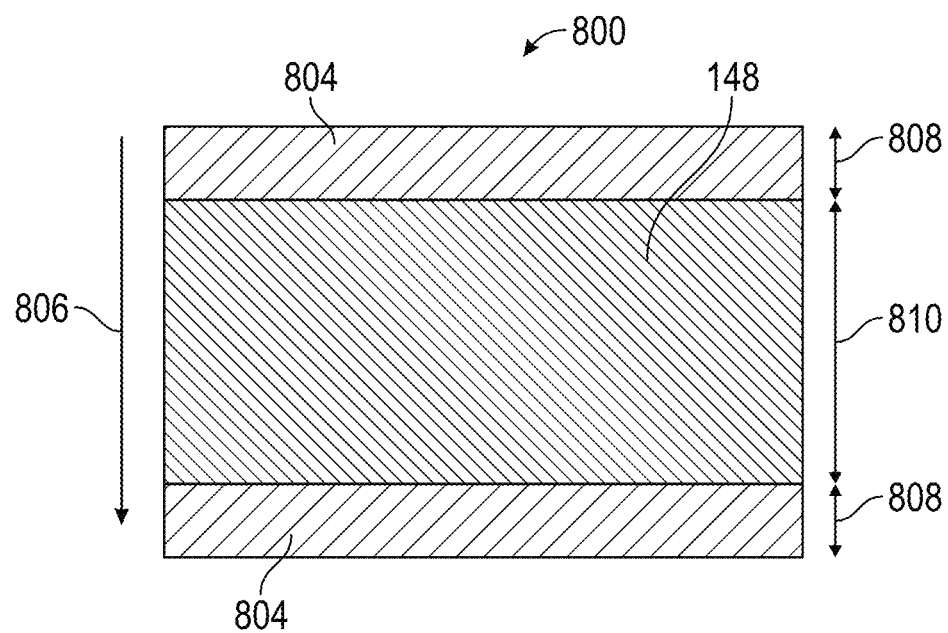
FIG. 8A illustrates a schematic of the steel with EMI shielding composites.
Figure 8B:
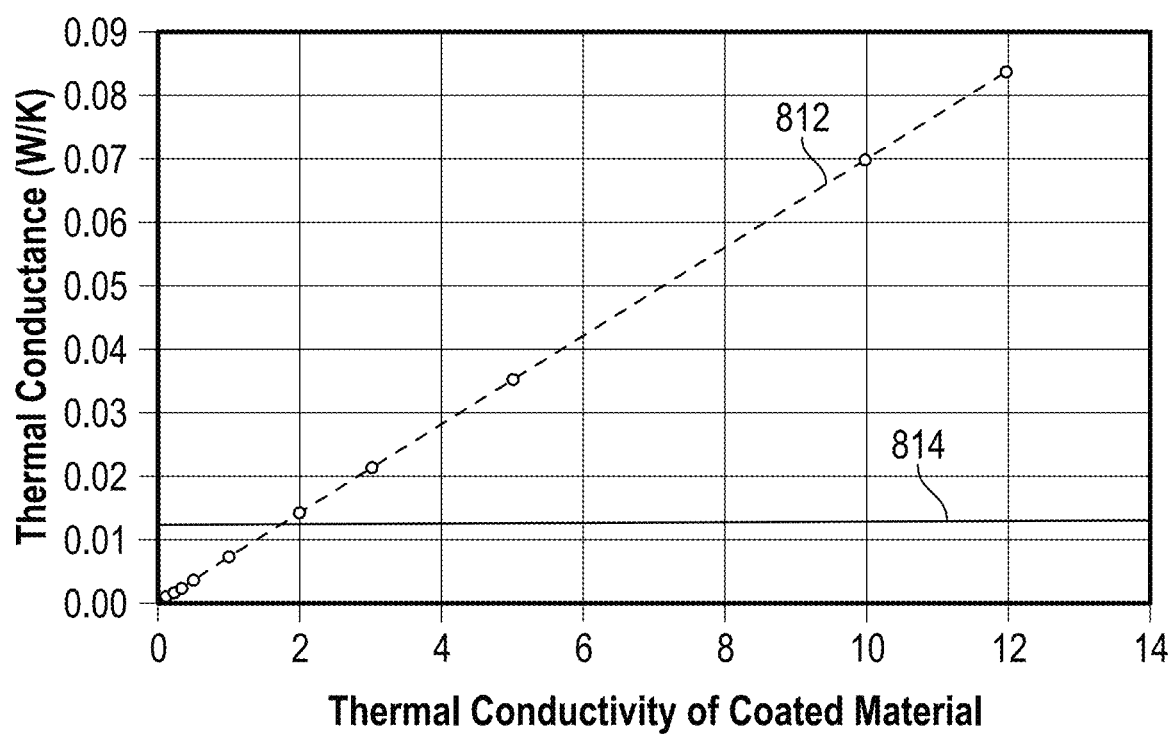
FIG. 8B is a graph illustrating the effect of thermal conductivity on thermal conductance of a steel sheets sandwiching an EMI shielding composite.

FIGS. 8A and 8B provide an illustrative example of the effect of thermal conductivity of EMI shielding composites 148 sandwiched between two steel sheets. FIG. 8A illustrates a schematic of the sandwiches 800 as tested. The sandwiches 800 included an EMI shielding composite layer 148, wherein the polyphthalamide is the substrate layer, EMI layer is ZnO and the conductive layer is Al-bronze, sandwiched between two silicon steel sheets 804, wherein the steel sheets 804 are aligned perpendicular to the direction 806 of heat flow. Adhesive layers of 2 micrometer thick epoxy binder were used to bond the steel sheets 804 to the EMI shielding composites 148. The steel sheets 804 each exhibited a thickness 808 of 0.025 millimeters and the EMI shielding composite layer 148 exhibited a thickness 810 of 0.2 millimeters. It was found that as the thermal conductivity of the EMI shielding composite layer 148 increased, the thermal conductance of the EMI shielding composite layer 148 and the steel sheets 804 increased illustrated by line 812. The thermal conductivity was measured in the 290 K to 300 K temperature range by steady state heat flow using Fourier methods using a Quantum Design physical property measurement testing system. The thermal conductance of the sheet steel with an adhesive material alone was found to be 0.011 W/K illustrated by line 814.

Figure 9:
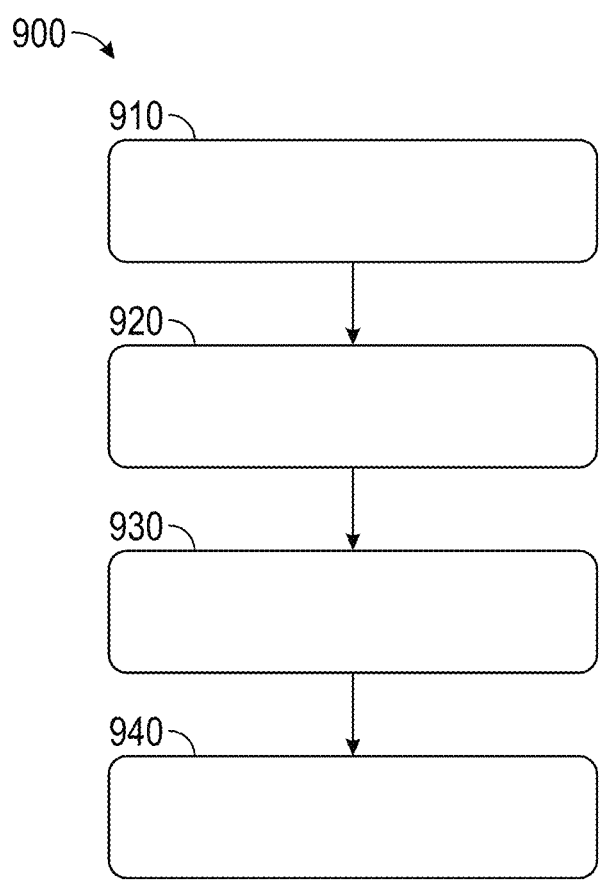
FIG. 9 is a flow chart of a method for forming the EMI shielding composites according to embodiments of the present disclosure.

FIG. 9, with reference to FIGS. 1A, 1B, 1C, 2A and 2B, illustrates a method 900 of forming an electromagnetic shielding composite 148 and integrated power electronics module packaging 104. At block 910 the polymer substrate 150 is molded using one or more of various molding processes, such as injection molding, compression molding, vacuum forming, blow molding, casting, etc. The polymer substrate 150 is molded into the desired shape of the packaging 104 for the integrated power electronics module 102, such as the cover 108, the external polymer housing compartment 144, the internal housing compartment 146 portions of the housing compartment 106, the entire housing compartment 106, or other component for which electromagnetic interference shielding is desired. Each portion of the packaging 104 may be molded separately, or portions may be molded together.

At block 920 the electromagnetic interference layer 152 is formed on the polymer substrate 150. The electromagnetic interference layer 152 is deposited utilizing one or more of the following coating methods such as vapor deposition, including chemical or physical vapor deposition; and physical coating wherein a particle dispersion of an electromagnetic interference material within a binder, such as spray coating, spin coating, or dip coating. The particles in the particle dispersion may be formed by milling the particles and the binder may include, for example, polyester.

At block 930 the conductive coating 154 is deposited onto the electromagnetic interference layer 152. The conductive coating 154 may be deposited by one or more of the following processes: thermal spray, plasma spray, electrodeposition, additive manufacturing including 3D printing, and vapor deposition, such as physical vapor deposition or chemical deposition. Optionally, at block 940, the various components of the integrated power electronics module packaging 104 may be assembled.

The EMI shielding composites described herein offer several advantages. Some of these advantages include the ability to package relatively higher efficiency integrated power electronics, obtaining relatively greater power output from integrated power electronics, or both. Another advantage includes reducing degradation in the efficiencies of integrated power electronics due to high temperature demagnetization and vibration, by facilitating removal of heat and damping of vibration. A further advantage of the EMI shielding composite includes allowing the deployment of polymer materials in integrated power electronic modules, due to the relatively lower weight of the polymer materials and increased design flexibility, while still exhibiting the conductivity characteristics of metal, or metal alloy, packaging.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. An electromagnetic interference shielding composite, comprising:
a polymer substrate formed into a shape of a packaging component;
an electromagnetic interference layer contacting the polymer substrate, wherein the electromagnetic interference layer exhibits a thickness in a range of 2 micrometers to 100 micrometers and the electromagnetic interference layer includes grains having a size in a range of 10 nanometers to 20 micrometers; and
a conductive coating contacting the electromagnetic interference layer.

2. The electromagnetic interference shielding composite of claim 1, wherein the electromagnetic interference layer exhibits a shielding efficiency in the range of 10 decibels to 45 decibels in a frequency range of 50 MHZ to 400 MHz.

3. The electromagnetic interference shielding composite of claim 2, wherein the electromagnetic interference layer is formed from one or more of the following electromagnetic interference materials: silicon, zinc, $Fe_2O_3$, FeO, $ZnFe_2O_4$, Ni—Zn, Mn—ZnO, Co—ZnO, NiAl—Mn, Co—$TiO_2$, $BaTiO_3$, and $ZrO_3$.

4. The electromagnetic interference shielding composite of claim 1, wherein the conductive coating exhibits a thickness in a range of 10 nanometers to 500 micrometers.

5. The electromagnetic interference shielding composite of claim 1, wherein the conductive coating exhibits a thermal conductivity in a range of 10 W/m-K to 200 W/m-K.

6. The electromagnetic interference shielding composite of claim 1, wherein the conductive coating exhibits an electrical resistivity in a range of $1\times10^{-5}$ Ohm-m to $1\times10^{-8}$ Ohm-m.

7. The electromagnetic interference shielding composite of claim 6, wherein the conductive coating exhibits a shielding efficiency in a range of 25 decibels to 45 decibels in a frequency range of 400 MHz to 1000 MHz.

8. The electromagnetic interference shielding composite of claim 7, wherein the conductive coating includes one or more of the following: copper, aluminum, nickel, zinc, cobalt, manganese, Al-bronze, AlSi, CuO, ZnO, and $Al_2O_3$.

9. The electromagnetic interference shielding composite of claim 1 wherein the polymer substrate comprises foam and exhibits a thickness in a range of 0.5 millimeters to 3 millimeters.

10. The electromagnetic interference shielding composite of claim 9, wherein the electromagnetic interference layer includes grains having a size in a range of 10 nanometers to 20 micrometers and the electromagnetic interference layer exhibits a shielding efficiency in the range of 10 decibels to 45 decibels in a frequency range of 50 MHZ to 400 MHz.

11. The electromagnetic interference shielding composite of claim 10, wherein the conductive coating exhibits a thickness in the range of 10 nanometers to 500 micrometers and conductive coating exhibits a shielding efficiency in a range of 25 decibels to 45 decibels in the 400 MHz to 1000 MHz range.

12. The electromagnetic interference shielding composite of claim 1, wherein the polymer substrate is polyether ether ketone.

13. An integrated power electronic module, comprising:
packaging including an electromagnetic interference shielding composite including:
a polymer substrate formed into a shape of a packaging component,
an electromagnetic interference layer contacting the polymer substrate, wherein the electromagnetic interference layer exhibits a thickness in a range of 2 micrometers to 100 micrometers and the electromagnetic interference layer includes grains having a size in a range of 10 nanometers to 20 micrometers, and
a conductive coating contacting the electromagnetic interference layer; and
electronics housed within the packaging.

14. The integrated power electronic module of claim 13, wherein the packaging includes a housing compartment and a cover.

15. The integrated power electronic module of claim 14, wherein the cover defines at least one opening and includes an interior surface, and a seal surrounding the opening is affixed to the interior surface.

16. The integrated power electronic module of claim 13, wherein the polymer substrate comprises foam and exhibits a thickness in a range of 0.5 millimeters to 3 millimeters.

17. The integrated power electronic module of claim 16, wherein the electromagnetic interference layer exhibits a shielding efficiency in the range of 10 decibels to 45 decibels in a frequency range of 50 MHz to 400 MHz.

18. The integrated power electronic module of claim 17, wherein the conductive coating exhibits a thickness in the range of 10 nanometers to 500 micrometers and conductive coating exhibits a shielding efficiency in a range of 25 decibels to 45 decibels in a frequency range of 400 MHz to 1000 MHz range.

19. The integrated power electronic module of claim 13, further comprising an internal polymer housing compartment housing a bulk capacitor.

20. A method of forming an electromagnetic interference shielding composite for an integrated power electronic module, comprising:
molding a polymer substrate into a shape of a packaging component;
forming an electromagnetic interference layer on the polymer substrate, wherein the electromagnetic interference layer exhibits a thickness in a range of 2 micrometers to 100 micrometers and the electromagnetic interference layer includes grains having a size in a range of 10 nanometers to 20 micrometers; and
forming a conductive coating on the electromagnetic interference layer.

* * * * *